(12) United States Patent
Nakamura et al.

(10) Patent No.: US 8,729,542 B2
(45) Date of Patent: May 20, 2014

(54) ORGANIC ELECTROLUMINESCENCE ELEMENT

(75) Inventors: Masahiro Nakamura, Findhoven (NL); Masahito Yamana, Hyogo (JP); Mitsuo Yaguchi, Osaka (JP); Takeyuki Yamaki, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/885,583

(22) PCT Filed: May 14, 2012

(86) PCT No.: PCT/JP2012/062254
§ 371 (c)(1),
(2), (4) Date: May 15, 2013

(87) PCT Pub. No.: WO2012/161004
PCT Pub. Date: Nov. 29, 2012

(65) Prior Publication Data
US 2013/0240861 A1    Sep. 19, 2013

(30) Foreign Application Priority Data

May 20, 2011  (JP) ................................. 2011-113516

(51) Int. Cl.
*H01L 51/50*    (2006.01)
(52) U.S. Cl.
USPC ........................................................... 257/40
(58) Field of Classification Search
CPC ............................. H01L 51/50; H01L 2227/32
USPC .................... 257/40, 59, 72, 79, 88, E51.001
See application file for complete search history.

(56) References Cited

U.S. PATENT DOCUMENTS

| 6,844,672 | B2 | 1/2005 | Yamazaki |
| 7,247,512 | B2 | 7/2007 | Yamazaki |
| 8,093,805 | B2 | 1/2012 | Sakamoto et al. |
| 2003/0015961 | A1 | 1/2003 | Yamazaki |

(Continued)

FOREIGN PATENT DOCUMENTS

| JP | 2002-502540 A | 1/2002 |
| JP | 2003-092191 A | 3/2003 |

(Continued)

OTHER PUBLICATIONS

International Search Report for corresponding International Application No. PCT/JP2012/062254 mailed Aug. 14, 2012.

(Continued)

*Primary Examiner* — Whitney T Moore
(74) *Attorney, Agent, or Firm* — Renner, Otto, Boisselle & Sklar, LLP

(57) ABSTRACT

Providing an organic electroluminescence element that can reduce the unevenness of the brightness and can improve the external quantum efficiency. The organic electroluminescence element includes a substrate 10, a first electrode 20, a second electrode 40, a functional layer 30 interleaved between the first electrode 20 the second electrode 40 and including a light emission layer 32, and a conductive layer 50. The resistivities of the first electrode 20 and the second electrode 40 are less than the resistivity of transparent conductive oxide. The second electrode 40 has an opening for light extraction. The functional layer 30 includes, as the outermost layer on the second electrode 40 side, a carrier injection layer 34. The conductive layer 50 is optically transparent and is in contact with the second electrode 40 and the functional layer 30. The carrier injection layer 34 has a recess in the projection domain of the opening.

9 Claims, 4 Drawing Sheets

(56) References Cited

U.S. PATENT DOCUMENTS

| | | |
|---|---|---|
| 2005/0118745 A1 | 6/2005 | Yamazaki |
| 2006/0017375 A1 | 1/2006 | Noguchi et al. |
| 2006/0279202 A1 | 12/2006 | Sakamoto et al. |
| 2008/0122351 A1 | 5/2008 | Kitazume |

FOREIGN PATENT DOCUMENTS

| | | |
|---|---|---|
| JP | 2006-331694 A | 12/2006 |
| JP | 2006-331920 A | 12/2006 |
| JP | 2008-135259 A | 6/2008 |
| JP | 2008-153237 A | 7/2008 |
| JP | 2010-033936 A | 2/2010 |
| JP | 2010-153071 A | 7/2010 |
| WO | 98/07136 A2 | 2/1998 |

OTHER PUBLICATIONS

Form PCT/ISA/237 for corresponding International Application No. PCT/JP2012/062254 dated Aug. 14, 2012.

ORGANIC ELECTROLUMINESCENCE ELEMENT

TECHNICAL FIELD

The invention relates to an organic electroluminescence element.

BACKGROUND ART

It has been known an organic electroluminescence element having a configuration shown in FIG. 7 (see e.g. JP2006-331694A; Patent Document 1). This organic electroluminescence element includes: one electrode (cathode) 101 disposed on a top surface of a substrate 104; a light emission layer 103 disposed on a top surface of the electrode 101 with interleaving an electron injection/transport layer 105 therebetween; and the other electrode (anode) 102 disposed on the light emission layer 103 with interleaving a hole injection/transport layer 106 therebetween. This organic electroluminescence element includes a sealing member 107 on the top surface side of the substrate 104. With this organic electroluminescence element, the light that is emitted from the light emission layer 103 passes through the electrode 102 that is designed as an optically transparent electrode and through the sealing member 107 formed of a transparent body, and then is radiated outward.

The electrode 101 is designed as a light reflective electrode, and is made of e.g. Al, Zr, Ti, Y, Sc, Ag, or In. The electrode 102 of the optically transparent electrode is made of e.g. indium tin oxide (ITO) or indium zinc oxide (IZO).

In an organic electroluminescence element, it needs a large electric current in order to obtain a high-brightness light. However, in a general organic electroluminescence element, the anode formed of an ITO film has a larger sheet resistance than that of the cathode formed of a metal film, an alloy film, a metal compound film or the like. Therefore, the anode has a larger potential gradient. Thus, the prior (general) organic electroluminescence element has a large unevenness of brightness in the in-plane direction.

In order to overcome the problem of the electroluminescence lamp including the electrode of an ITO film that is formed by sputtering, it has been proposed an electroluminescence lamp including an electrode that is formed of a material other than ITO (see JP2002-502540A; hereinafter referred to as Patent Document 2). Patent Document 2 discloses an electroluminescence lamp 210 that includes a first conductive layer 220, an electroluminescent material 230, a second conductive layer 240, and a substrate 245. The first conductive layer 220 is formed in a shape of a rectangular grid electrode provided with rectangular-shaped openings 250, as shown in FIG. 8.

Patent Document 2 describes that the first conductive layer 220 and the second conductive layer 240 are preferably made of conductive ink such as silver ink, copper ink or the like. Patent Document 2 describes that the first conductive layer 220, the electroluminescent material 230, and the second conductive layer 240 are formed by screen printing, offset printing or the like.

Patent Document 2 describes that if a uniform brightness lamp 210 is required the density of openings 250 should be approximately constant over the lamp's surface.

In the electroluminescence lamp 210 shown in FIG. 8, the first conductive layer 220 has the openings 250. Therefore, "carrier" is injected from the first conductive layer 220 into the electroluminescent material 230 only through a region which overlaps with the first conductive layer 220. Therefore, in this electroluminescence lamp 210, the electroluminescent material 230 has an inferior luminous efficiency at regions corresponding to the openings 250. As a result, this electroluminescence lamp 210 has a concern that the external quantum efficiency becomes low.

DISCLOSURE OF INVENTION

The present invention is developed in view of the above problem, and the object of the invention is to provide an organic electroluminescence element that has an improved external quantum efficiency and has a less unevenness of brightness.

An organic electroluminescence element of the invention including: a substrate; a first electrode arranged on a first surface side of the substrate; a second electrode arranged on the first surface side of the substrate so as to face the first electrode; and a functional layer interleaved between the first electrode and the second electrode, the functional layer including a light emission layer, wherein the resistivities of the first electrode and the second electrode are less than the resistivity of transparent conducting oxide, respectively, wherein the functional layer includes a carrier injection layer as the outermost layer located on the second electrode side of the light emission layer, wherein the second electrode is provided with an opening for extracting light emitted from the functional layer, wherein a conductive layer is formed in the opening so as to be in contact with the second electrode and the functional layer, the conductive layer being optically transparent, wherein the second electrode is covered with the conductive layer, and wherein the carrier injection layer is provided with a recess in the projection domain of the opening.

In the organic electroluminescence element, it is preferred that the recess is formed in a shape that an interval between a boundary of the projection domain of the second electrode and a side surface of the recess adjacent to this boundary increases with increasing distance from the second electrode in the thickness direction of the carrier injection layer.

In the organic electroluminescence element, it is preferred that the second electrode is an electrode including metallic powder and organic binder.

In the organic electroluminescence element, it is preferred that the conductive layer is a transparent conductive film including conductive nanostructure and transparent medium; or a metal thin film having a thickness that allows to pass therethrough the light emitted from the functional layer.

In the organic electroluminescence element, it is preferred that a thickness of the carrier injection layer in the projection domain of the opening is smaller than a thickness of the carrier injection layer in the projection domain of the second electrode.

The electroluminescence element of the invention can achieve an improved external quantum efficiency and a less unevenness of brightness.

BRIEF DESCRIPTION OF DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

First Embodiment

Figure 1:
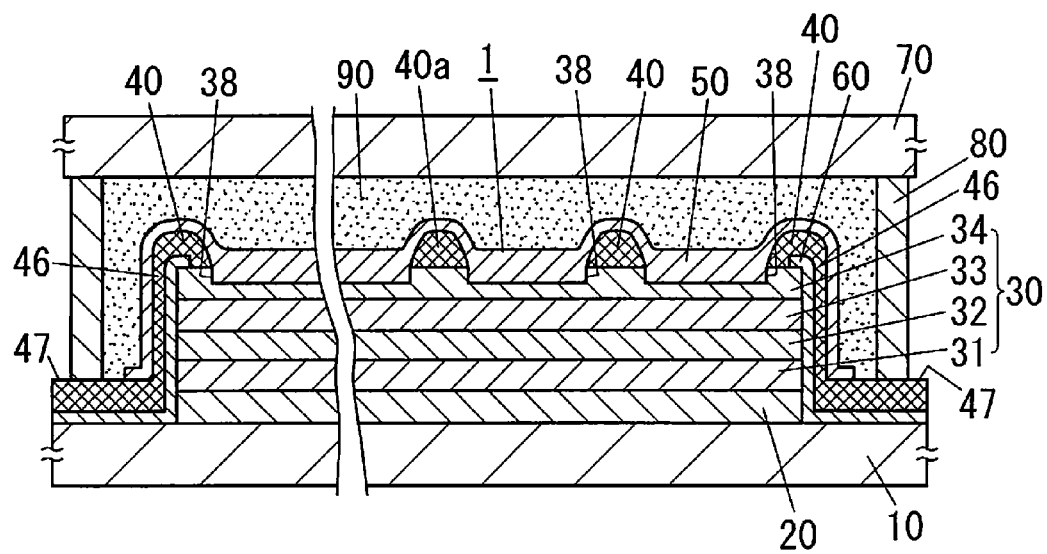
FIG. 1 is a schematic sectional view of an organic electroluminescence element of first embodiment.

An organic electroluminescence element of the embodiment is described below with reference to FIGS. 1 to 5.

The organic electroluminescence element includes: a substrate 10; a first electrode 20 arranged on a first surface side (upper side in FIG. 1) of the substrate 10; a second electrode 40 arranged on the first surface side of the substrate 10 so as to face the first electrode 20; and a functional layer 30 interleaved between the first electrode 20 and the second electrode 40. The functional layer 30 includes a light emission layer 32.

In other words, the organic electroluminescence element of the embodiment includes: the first electrode 20 and the second electrode 40 disposed so as to face each other; and the functional layer 30 disposed between the first electrode 20 and the second electrode 40.

The organic electroluminescence element includes: a first terminal (not shown) electrically connected to the first electrode 20 by means of a first conductive pattern (not shown); and a second terminal 47 electrically connected to the second electrode 40 by means of a second conductive pattern 46. The first conductive pattern, the first terminal, the second conductive pattern 46 and the second terminal 47 are formed on the first surface side of the substrate 10. The organic electroluminescence element includes an insulation film 60 that is formed on the first surface side of the substrate 10 so as to electrically insulate the second conductive pattern 46 from the functional layer 30, the first electrode 20 and the first conductive pattern. The insulation film 60 is formed continuously over the first surface of the substrate 10, a side surface of the first electrode 20, a side surface of the functional layer 30, and a periphery of a second electrode 40 side surface of the functional layer 30.

In the organic electroluminescence element, the resistivities (electric resistivities) of the first electrode 20 and the second electrode 40 are lower than the resistivity (electric resistivity) of Transparent Conducting Oxide (TCO), respectively. Examples of the transparent conducting oxide include ITO, AZO, GZO and IZO. The resistivity of the transparent conducting oxide is, although not limited, exemplified as $1*10^{-4}$ [Ω·cm] to $1*10^{-3}$ [Ω·cm].

In the organic electroluminescence element, the functional layer 30 includes a carrier injection layer 34 for stabilizing the injection property of carrier from the second electrode 40. The carrier injection layer 34 is formed as the outermost layer of the functional layer 30, and is located on the second electrode 40 side viewed from the light emission layer 32.

The second electrode 40 is provided with openings 41 for extracting the light from the functional layer 30. In other words, the organic electroluminescence element includes the second electrode 40 with the openings 41 (see FIGS. 2 and 3) for extracting the light from the functional layer 30.

The organic electroluminescence element includes an optically transparent conductive layer 50. The conductive layer 50 is formed so as to be in contact with the functional layer 30 (carrier injection layer 34) and the second electrode 40. With this configuration, the organic electroluminescence element can emit the light from a side of the second electrode 40. Therefore, the organic electroluminescence element of the embodiment is allowed to be used as a top-emission type organic electroluminescence element.

The second electrode 40 is covered with the conductive layer 50. In the embodiment, the second electrode 40 and the carrier injection layer 34 are covered with the conductive layer 50. The carrier injection layer 34 is provided with recesses 38 in the projection domain of the openings 41.

It is preferred that the organic electroluminescence element includes: an optically transparent cover substrate 70 that is arranged on the first surface side of the substrate 10 so as to face the substrate 10; and a frame member 80 having a frame shape (rectangular frame shape in the embodiment) that is disposed between the periphery of the substrate 10 and the periphery of the cover substrate 70. It is preferred that the organic electroluminescence element includes a sealing member 90 which is made of an optically transparent material (e.g. optically transparent resin) and which is filled in a space enclosed by the substrate 10, the cover substrate 70 and the frame member 80 so as to seal an element section 1, where the element section 1 includes the first electrode 20, the functional layer 30, the second electrode 40 and the conductive layer 50.

Each component of the organic electroluminescence element is described further detail below.

The substrate 10 is formed into a rectangular shape in a planar view. Note that, the shape of the substrate 10 in a planar view is not limited to a rectangular shape, and it may be a circular shape, a polygonal shape other than the rectangular shape, or the like.

The substrate 10 is formed of a glass substrate, but is not limited thereto. For example, a plastic plate, a metal plate, or the like may be used for the substrate 10. Examples of materials of the glass substrate include soda-lime glass and non-alkali glass and the like. Examples of materials of the plastic plate include polyethylene terephthalate, polyethylene naphthalate, poly ether sulfone, polycarbonate and the like. Examples of materials of the metal plate include aluminum, copper, stainless steel and the like. As to the plastic plate, in order to suppress the transmission of water, it is preferred to use a plastic plate including a plastic substrate and a SiON film, SiN film or the like, formed on the plastic substrate. The substrate 10 may be rigid or flexible.

In a case where the substrate 10 is formed of a glass substrate, irregularity of the first surface of the substrate 10 may cause a leak current of the organic electroluminescence element (i.e. may cause deterioration of the organic electroluminescence element). Therefore, in a case where the glass substrate is used for the substrate 10, it is preferred to prepare a glass substrate for device formation which is highly-polished such that the first surface has a sufficiently small roughness. As to the roughness of the first surface of the substrate 10, it is preferred that the arithmetic mean estimation Ra defined by JIS B 0601-2001 (ISO 4287-1997) of the first surface is equal to or smaller than 10 [nm], and it is further preferred that the Ra thereof is equal to or smaller than several nanometers. Note that, in a case where the plastic plate is used for the substrate 10, it can be obtained such a plastic plate that the arithmetic mean estimation Ra of the first surface is equal to or smaller than several nanometers with a low cost, without need of highly precise polishing.

The cover substrate 70 is formed of a glass substrate, but is not limited thereto. For example, a plastic plate or the like may be used for the cover substrate 70. Examples of materials of the glass substrate include soda-lime glass, non-alkali glass and the like. Examples of materials of the plastic plate include polyethylene terephthalate, polyethylene naphthalate, poly ether sulfone, polycarbonate and the like.

In the embodiment, the cover substrate 70 has a flat plate shape, but the cover substrate 70 is not limited to have a flat plate shape. For example, the cover substrate 70 may be provided with a concave portion for accommodating the element section 1 at a surface thereof facing the substrate 10, and whole of the periphery of the facing surface around the concave portion may be bonded to the substrate 10. In other words, it is possible that the electroluminescence element includes the cover substrate 70 having a box shape with an opening on one surface thereof, the element section 1 is accommodated inside the cover substrate 70, and the periphery of the opening of the cover substrate 70 is bonded to the substrate 10. This configuration has an advantage that there is no need to prepare the frame member 80 that should be arranged separately from the cover substrate 70. On the other hand, in the configuration where the cover substrate 70 of a flat plate shape and the frame member 80 of a frame shape are used, there is an advantage that the cover substrate 70 which is required to have a particular optical property (e.g. optical transmittance, refractive index) and the frame member 80 which is required to have a particular physical property (e.g. airtightness) can be made of different materials, such that both requests can be satisfied individually.

It is preferred that the organic electroluminescence element includes a light extracting structure (not shown) on an outer surface side of the cover substrate 70 (on the opposite side of the cover substrate 70 from the substrate 10; upper side of the cover substrate 70 in FIG. 1) for suppressing the reflection, caused at the outer surface of the cover substrate 70, of the light emitted by the light emission layer 32. The light extracting structure may be a concave-convex structure having two-dimensional periodic structure. In a case where the wavelength of the light emitted by the light emission layer 32 is set within a range of 300 [nm] to 800 [nm], periodic length of the two-dimensional periodic structure is preferably set within a range of quarter to tenfold of $\lambda$, where $\lambda$ is the wavelength of the light in the medium (i.e. $\lambda$ is obtained by dividing the wavelength in vacuum by the refractive index of the medium). The concave-convex structure can be preliminarily formed on the outer surface side of the cover substrate 70 by way of imprint process such as thermal imprint process (thermal nanoimprint process) or optical imprint process (optical nanoimprint process). In a case where the cover substrate 70 is made of a particular material that allows to form the cover substrate 70 by injection molding, the concave-convex structure can be formed directly on the cover substrate 70 by using a proper mold when the cover substrate 70 is formed by the injection molding. The concave-convex structure may be arranged separately from the cover substrate 70. For example, the concave-convex structure can be constituted by a prismatic sheet (e.g. light diffusion film such as LIGHT-UP GM3 manufactured by KIMOTO CO., LTD.).

The organic electroluminescence element of the embodiment includes the light extracting structure, and therefore the reflection loss of the light which is emitted by the light emission layer 32 and which reaches the outer surface of the cover substrate 70 can be reduced. As a result, this configuration can improve the light extraction efficiency.

The first surface side of the substrate 10 and the frame member 80 are bonded to each other by means of a first bonding material. The first bonding material is epoxy resin in the embodiment, but is not limited thereto. For example, acrylic resin or the like can be used. Epoxy resin, acrylic resin etc. used as the first bonding material may be ultraviolet-curing resin, thermosetting resin, or the like. Filler (made of e.g. silica, alumina) containing epoxy resin also can be used for the first bonding material. The frame member 80 is bonded to the first surface side of the substrate 10 so that the surface of the frame member 80 facing the substrate 10 is hermetically bonded along the whole periphery thereof. The frame member 80 and the cover substrate 70 are bonded to each other by means of a second bonding material. The second bonding material is epoxy resin in the embodiment, but is not limited thereto. For example, acrylic resin, fritted grass or the like can be used. Epoxy resin, acrylic resin etc. used as the second bonding material may be ultraviolet-curing resin, thermosetting resin, or the like. Filler (made of e.g. silica, alumina) containing epoxy resin also can be used for the second bonding material. The frame member 80 is bonded to the cover substrate 70 so that the surface of the frame member 80 facing the cover substrate 70 is hermetically bonded along the whole periphery thereof.

Examples of materials of the insulation film 60 include polyimide, novolak resin, epoxy resin and the like.

Examples of the optically transparent materials used as the material of the sealing member 90 include epoxy resin, silicone resin and the like. The optically transparent material preferably has a comparatively small refractive index difference from the functional layer 30. Examples of the optically transparent material further include optically transparent resin including light diffusion material formed of glass and the like. The optically transparent material may be Organic-Inorganic Hybrid Material in which organic constituent and inorganic constituent are mixed and bound on nanometer or molecular level.

In the organic electroluminescence element of the embodiment, the first electrode 20 constitutes a cathode and the second electrode 40 constitutes an anode. In the embodiment therefore, "first carrier" which is injected from the first electrode 20 to the functional layer 30 is "electron", and "second carrier" which is injected from the second electrode 40 to the functional layer 30 is "hole". The functional layer 30 includes: a carrier injection layer 31 (hereinafter, referred to as "first carrier injection layer 31") for stabilizing the injection property of the first carrier; the light emission layer 32; an interlayer 33; and the abovementioned carrier injection layer 34 (hereinafter, referred to as "second carrier injection layer 34") in this order from the first electrode 20. As shown in FIG. 1, in the functional layer 30 of the embodiment, the first carrier injection layer 31 is formed to adjoin the first electrode 20. The light emission layer 32 is formed to adjoin the first carrier injection layer 31. The interlayer 33 is formed to adjoin the light emission layer 32. The second carrier injection layer 34 is formed to adjoin the interlayer 33. The second electrode 40 is formed to adjoin the second carrier injection layer 34. In the organic electroluminescence element of the embodiment, the first carrier injection layer 31 that is located on the first electrode 20 side of the light emission layer 32 is an electron injection layer. The interlayer 33 is a first carrier-blocking layer that prevents the first carrier from leaking toward the second electrode 40 side, and is an electron-blocking layer in the embodiment. Note that, in a configuration in which the first electrode 20 constitutes an anode and the second electrode 40 constitutes a cathode, the first carrier injection layer 31 may be formed as a hole injection layer and the interlayer 33 (which constitutes the first carrier-blocking layer) may be formed as a hole-blocking layer.

Structure of the functional layer 30 is not limited to the abovementioned configuration. For example, a first carrier transport layer (electron transport layer in this configuration) may be provided between the first carrier injection layer 31 and the light emission layer 32, and/or a second carrier transport layer (hole transport layer in this configuration) may be provided between the light emission layer 32 and the interlayer 33. Note that, the functional layer 30 is not limited as long as including the light emission layer 32 and the second carrier injection layer 34 (i.e. the functional layer 30 may be constituted only by the light emission layer 32 and second carrier injection layer 34). That is, the first carrier injection layer 31, the first carrier transport layer, the interlayer 33, the second carrier transport layer and the like (i.e. layers other than the light emission layer 32 and the second carrier injection layer 34) may be provided if desired. The light emission layer 32 may be a single-layer structure or a multilayer structure. In a case where white light is required, the light emission layer may be doped with three kinds of dye materials, i.e. red, green, blue dyes; may have a laminate structure including a blue light emitting layer with a hole transport property, a green light emitting layer with an electron transport property and a red light emitting layer with an electron transport property; or may have a laminate structure including a blue light emitting layer with an electron transport property, a green light emitting layer with an electron transport property and a red light emitting layer with an electron transport property.

Examples of materials of the light emission layer 32 include Poly(p-phenylenevinylene) derivative, polythiophene derivative, poly(ρ-phenylene) derivative, polysilane derivative, and polyacetylene derivative; polymerized compound of such as polyfluorene derivative, polyvinyl carbazole derivative, chromoporic material, and luminescnce material of metal complexes; anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, quinoline-metal complex, tris(8-hydroxyquinolinate)aluminum complex, tris(4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, pyrane, quinacridone, rubrene and their derivatives; 1-aryl-2,5-di(2-thienyl)pyrrole derivative, distyrylbenzene derivative, distyrylarylene derivative, styrylarylene derivative, styrylamine derivative, and various compounds containing a group (radical) that is formed of the above-listed luminescent material. The material of the light emission layer 32 is not limited to compounds based on fluorescent dye listed above, and examples of materials of the light emission layer 32 include so-called phosphorescent material such as iridium complex, osmium complex, platinum complex, europium complex, and compounds or polymer molecules containing one of these complexes. One or plural of these materials can be selected and used as necessary. The light emission layer 32 is preferably formed by way of wet process such as coating method (spin coating, spray coating, die coating, gravure printing, screen printing, or the like). However, formation method of the light emission layer 32 is not limited to the coating method, and may be dry process such as vacuum evaporation method, transfer method, or the like.

Examples of materials of the electron injection layer include metal fluoride such as lithium fluoride and magnesium fluoride; metal halide such as metal chloride (e.g. sodium chloride, magnesium chloride and the like); oxide of e.g. titanium, zinc, magnesium, calcium, barium, strontium; and the like. In a case where the electron injection layer is made by such material, the electron injection layer can be formed by vacuum evaporation method. Also, the electron injection layer can be made of organic semiconductor material doped with dopant (such as alkali metal) for promoting electron injection. In a case where the electron injection layer is made by such material, the electron injection layer can be formed by coating method.

Material of the electron transport layer can be selected from a group of compounds having an electron transport property. Examples the compounds of this kind include metal complex known as an electron transporting material such as Alq3; compounds containing hetero ring such as phenanthroline derivative, pyridine derivative, tetrazine derivative, oxadiazole derivative and the like. However, the material of the electron transport layer is not limited thereto, and may be any materials which are generally known to have an electron transporting property. In a case where the electron transport layer is made by such material, the electron transport layer can be formed by coating method.

The hole transport layer can be made of low-molecular material or polymeric material having comparatively low LUMO (Lowest Unoccupied Molecular Orbital) level. Examples of materials of the hole transport layer include polymer containing aromatic amine such as polyarylene derivative containing aromatic amine on the side chain or the main chain, e.g., polyvinyl carbazole (PVCz), polypyridine, polyaniline and the like. However, the material of the hole transport layer is not limited thereto. Examples of materials of the hole transport layer include 4,4'-bis[N-(naphthyl)-N-phenyl-amino]biphenyl (alpha-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, TNB and the like. The hole transport layer can be formed by coating method.

The interlayer 33 has a carrier blocking function (electron blocking function in this configuration), and serves as a first carrier barrier (electron barrier in this configuration) that prevents the first carrier (electron in this configuration) from being leaked from the light emission layer 32 side to the second electrode 40 side. It is preferred that the interlayer 33 has a function of transporting the second carrier (hole in this configuration) to the light emission layer 32, a function of preventing the deactivation of excited-state of the light emission layer 32, and the like.

In the organic electroluminescence element, the luminous efficiency and the life-time of the organic electroluminescence element can be improved by providing the interlayer 33. Examples of materials of the interlayer 33 include polyallylamine and derivative thereof, polyfluorene and derivative thereof, polyvinyl carbazole and derivative thereof, triphenyldiamine derivative and the like. The interlayer 33 can be formed by way of wet process such as coating method (spin coating, spray coating, die coating, gravure printing, or the like).

Examples of materials of the hole injection layer include organic material containing thiophene, triphenylmethane, hydrazoline, amylamine, hydrazone, stilbene, triphenylamine and the like. In detail, examples of materials of the hole injection layer include aromatic amine derivative such as polyvinyl carbazole, polyethylenedioxythiophene:polystyrenesulfonate (PEDOT:PSS), TPD and the like. These materials can be used alone or in combination. The hole injection layer can be formed by coating method.

The second carrier injection layer 34 is provided with the recesses 38 in the projection domain of the respective openings 41. In the second carrier injection layer 34, the thickness of the second carrier injection layer 34 in the projection domain of the opening 41 is smaller than that in the projection domain of the second electrode 40. It is preferred that the depth of the recess 38 is smaller than the thickness of the second carrier injection layer 34 in the projection domain of the second electrode 40 (i.e. it is preferred that the second carrier injection layer 34 is not provided with a through hole perforating thereof). Note that, value of the depth of the recess 38 is not particularly limited. The recess 38 can be formed by etching, printing method (screen printing or gravure printing), or the like.

The cathode is an electrode for injecting the electron (first charge) into the functional layer 30. In a case where the first electrode 20 is designed as the cathode, the electron (first charge) as the first carrier is injected from the first electrode 20 into the functional layer 30. The cathode is preferably made of electrode material such as metal, alloy, or electroconductive compound having a relatively small work function, or mixture thereof. Further, it is preferred that the cathode is made of material having a work function within a range of 1.9 [eV] to 5 [eV] in order to limit a difference between an energy level of the cathode and an LUMO (Lowest Unoccupied Molecular Orbital) level within an appropriate range. Examples of the electrode material of the cathode include aluminum, silver, magnesium, gold, copper, chrome, molybdenum, palladium, tin, and alloy of them or combination of other metal such as magnesium-silver mixture, magnesium-indium mixture, aluminum-lithium alloy and the like. The cathode may be formed of a laminate including a thin film made of aluminum and an ultrathin film (thinner than 1 [nm] so as to flow the electron through tunneling injection) made of metal, metal oxide, or mixture of them or combination of other metal, such as aluminum oxide. In a configuration where the first electrode 20 as the cathode is designed as a reflecting electrode, the cathode is preferably made of metal having high-reflectance with respect to the light emitted by the light emission layer 32 and having a low resistivity, such as aluminum or silver.

In a case where the first electrode 20 is designed as the anode for injecting the hole (second charge) as the first carrier into the functional layer 30, the first electrode 20 of the anode is preferably made of metal having a relatively large work function. It is preferred that the anode is made of material having a work function within a range of 4 [eV] to 6 [eV] in order to limit a difference between an energy level of the anode and a HOMO (Highest Occupied Molecular Orbital) level within an appropriate range.

The second electrode 40 is constituted by an electrode including metallic powder and organic binder. Examples of materials of the metallic powder include silver, gold, copper and the like. With this configuration, the resistivity and the sheet resistance of the second electrode 40 of the organic electroluminescence element can be made smaller compared with a case where the second electrode 40 is constituted by a thin film made of the transparent conductive oxide. Therefore, this configuration can reduce the unevenness of brightness by virtue of a lower resistance of the second electrode 40. Conductive material used for the second electrode 40 may be alloy, carbon black or the like, as substitute for metal.

The second electrode 40 can be formed by printing (by way of such as screen printing or gravure printing) a paste (printing ink) in which metallic powder, organic binder and organic solvent are mixed. Examples of materials of the organic binder include acrylic resin, polyethylene, polypropylene, polyethylene terephthalate, polymethylmethacrylate, polystyrene, polyether sulfone, polyarylate, polycarbonate resin, polyurethane, polyacrylonitrile, polyvinyl acetal, polyamide, polyimide, diacryl phthalate resin, cellulosic resin, polyvinyl chloride, polyvinylidene chloride, polyvinyl acetate, other thermoplastic resin, and copolymer containing at least two of the above-listed resin components. Note that, the material of the organic binder is not limited thereto.

In the organic electroluminescence element of the embodiment, the thickness of the first electrode 20 is set within a range of 80 [nm] to 200 [nm], the thickness of the first carrier injection layer 31 is set within a range of 5 [nm] to 50 [nm], the thickness of the light emission layer 32 is set within a range of 60 [nm] to 100 [nm], thickness of the interlayer 33 is set at 15 [nm], and the thickness of the second carrier injection layer 34 at a region overlapping with the second electrode 40 is set within a range of 10 [nm] to 100 [nm]. However, each thickness is not limited thereto.

Figure 2:
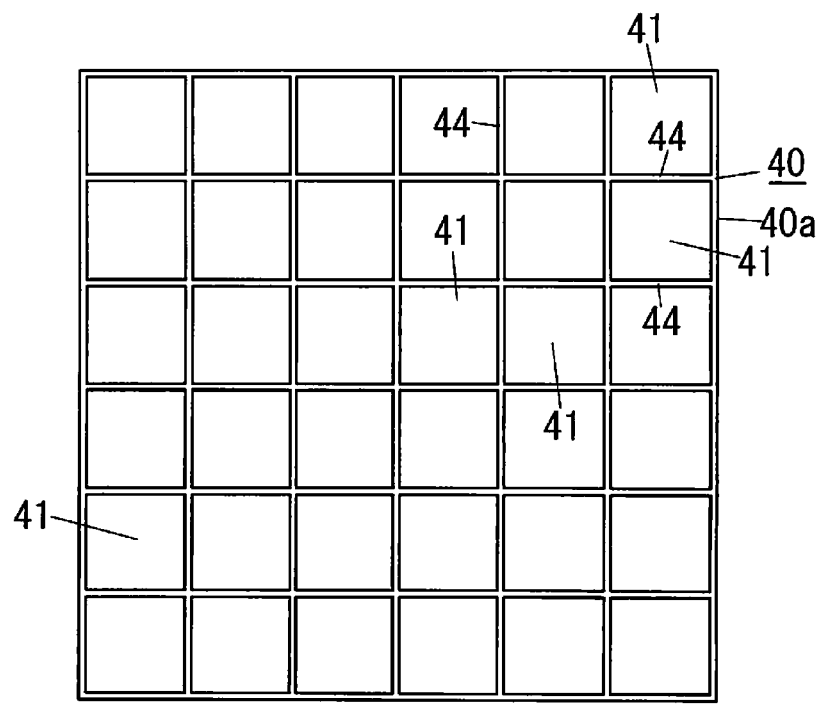
FIG. 2 is a schematic planar view of a second electrode of the organic electroluminescence element of the first embodiment.

As shown in FIGS. 1 and 2, the second electrode 40 is formed in a grid shape (netlike shape), and has a plurality (36 in the example shown in FIG. 2) of openings 41. The second electrode 40 of the embodiment has a plurality of thin line sections 44 extending in a first direction (top-bottom direction in FIG. 2) and a plurality of thin line sections 44 extending in a second direction (right-left direction in FIG. 2) that crosses the first direction. The opening 41 for extracting the light is constituted by a space confined by the thin line sections 44. In the second electrode 40 shown in FIG. 2, each opening 41 has a square shape. In other words, the second electrode 40 shown in FIG. 2 is formed in a square grid shape.

The second electrode 40 is constituted by an electrode pattern 40a having a square grid shape, and the electrode pattern 40a has a width L1 (see FIG. 3) which is set in a range of 1 [μm] to 100 [μm], a height H1 (see FIG. 3) which is set in a range of 50 [nm] to 100 [μm], and a pitch P1 (see FIG. 3) which is set in a range of 100 [μm] to 2000 [μm]. However, the exemplified numerical ranges of the width L1, the height H1, and the pitch P1 of the electrode pattern 40a are not particularly limited thereto, and they can be determined as appropriate in the light of a planar size of the element section 1. The width L1 of the electrode pattern 40a is preferably set to be small from a viewpoint of improving the use efficiency of the light emitted by the light emission layer 32. On the other hand, the width L1 of the electrode pattern 40a is preferably set to be large from a viewpoint of reducing the unevenness of brightness by reducing the resistance of the second electrode 40. The width L1 is therefore preferably determined as appropriate with consideration of a planar size of the organic electroluminescence element and the like. The height H1 of the second electrode 40 is further preferably set within a range of 100 [nm] to 10 [μm], in view of achieving low resistance of the second electrode 40; improving the efficiency in use of the material (usage efficiency of material) of the second electrode 40 when forming the second electrode 40 by coating method such as screen printing; improving the radiation angle of the light emitted from the functional layer 30; and the like.

Figure 3:
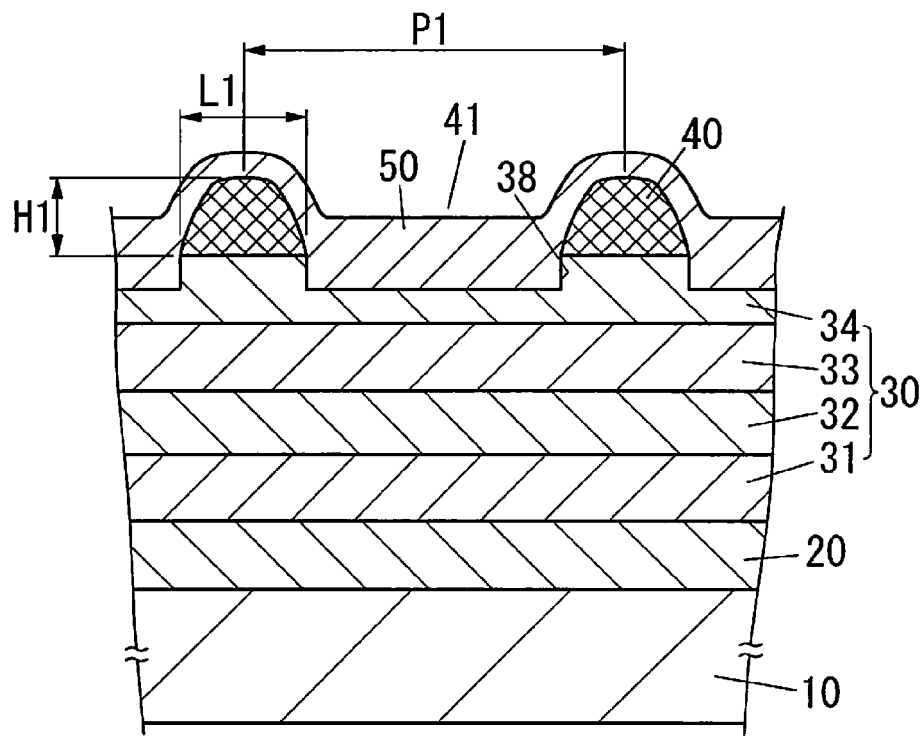
FIG. 3 is a schematic sectional view of main part of the organic electroluminescence element of the first embodiment.

In the organic electroluminescence element of the embodiment, the opening dimension of each opening 41 in the second electrode 40 increases with distance from the functional layer 30, as shown in FIGS. 1 and 3. Each thin line section 44 of the second electrode 40 is formed in a substantially trapezoidal shape in sectional view, such that the opening dimension of each opening 41 increases with distance from the functional layer 30. In the organic electroluminescence element of this configuration, the light from the functional layer 30 can be radiated in a wider angle. As a result, the organic electroluminescence element has a reduced unevenness of brightness. Furthermore, reflection loss and absorption loss which may be caused at the second electrode 40 can be reduced. Therefore, the organic electroluminescence element has a further improved external quantum efficiency.

The shape of each opening 41 formed in the grid-shaped second electrode 40 is not limited to a square shape, and may be a rectangular shape, an equilateral triangle shape, a regular hexagonal shape, or the like.

In a case where the shape of each opening 41 is designed to an equilateral triangle shape, the second electrode 40 is formed in a triangle grid shape. In a case where the shape of each opening 41 is designed to a regular hexagonal shape, the second electrode 40 is formed in a hexagonal grid shape. Furthermore, the second electrode 40 is not limited to have a grid shape, and may have a comb shape. The second electrode 40 may also be constituted by a combination of two electrode patterns each having a comb shape. The number of the openings 41 of the second electrode 40 is not particularly limited, and may be one or a plural. For example, in the case where the second electrode 40 has a comb shape or the second electrode 40 is constituted by the combination of two electrode patterns each having a comb shape, the number of the openings 41 may be one.

Figure 4:
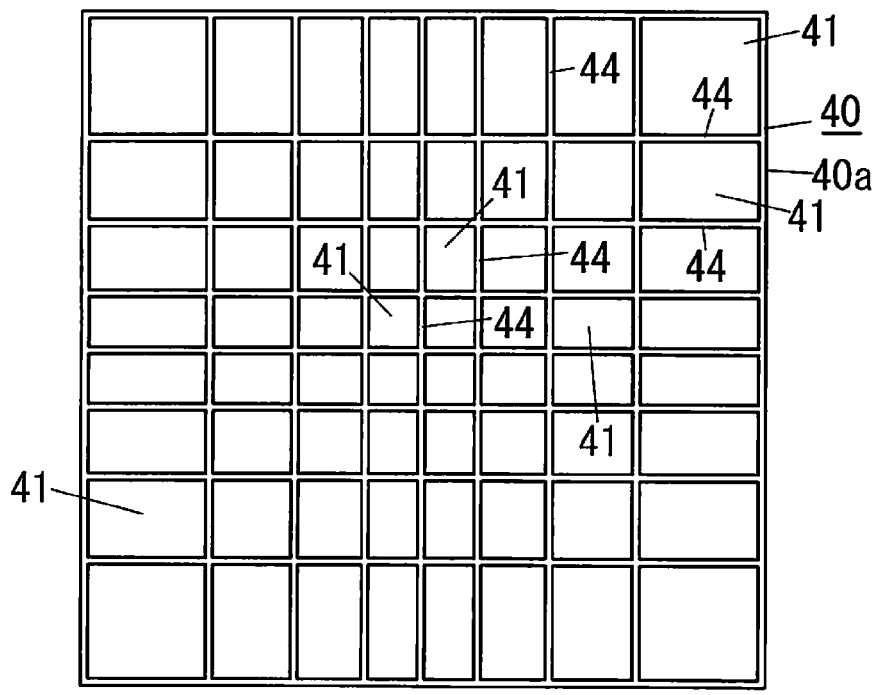
FIG. 4 is a schematic planar view of another second electrode of the organic electroluminescence element of the first embodiment.

The second electrode 40 may be formed to have a planar shape shown in FIG. 4. In this example, each thin line section 44, which is formed in a linear-shape in a planar view, of the electrode pattern 40a in the second electrode 40 has an identical line width. The interval between the thin line sections 44, 44 which are adjacent each other in parallel decreases toward the center of the second electrode 40. In other words, the opening dimension of the openings 41 decreases from the periphery toward the center of the second electrode 40. According to a configuration where the second electrode 40 has a planar shape shown in FIG. 4, the organic electroluminescence element can have an improved luminous efficiency at the center region of the second electrode 40 which is far from the second terminal 47 (see FIG. 1) than the periphery, compared with a configuration shown in FIG. 2. As a result, this configuration can improve the external quantum efficiency. According to a configuration where the second electrode 40 has a planar shape shown in FIG. 4, the organic electroluminescence element has a suppressed current concentration at the peripheral region of the functional layer 30 which is near the first terminal and the second terminal 47, compared with a configuration shown in FIG. 2. As a result, this configuration can extend the life time.

Figure 5:
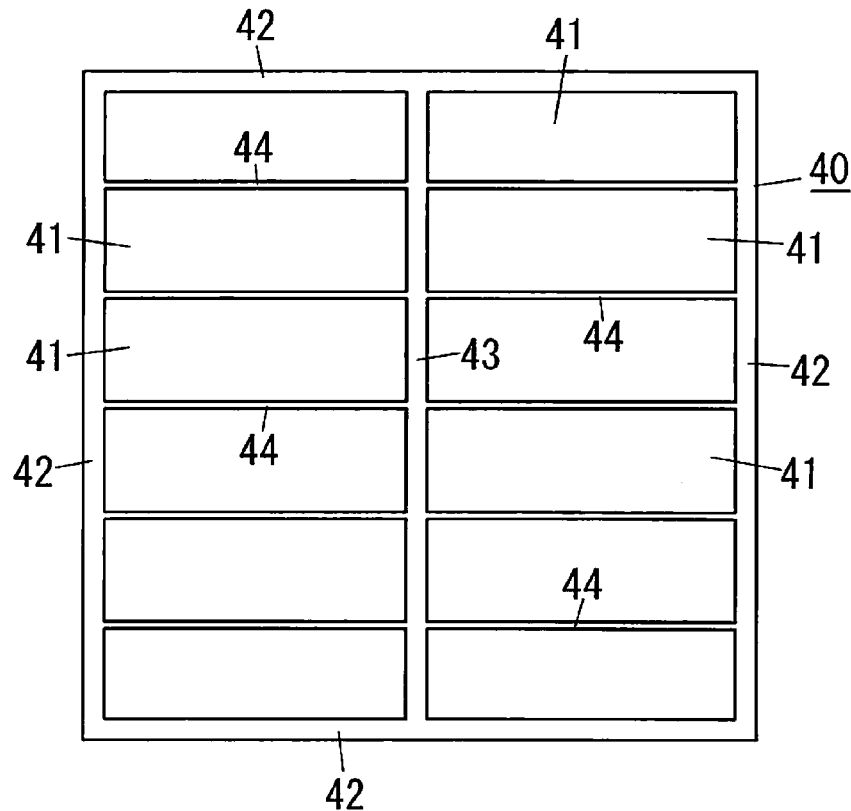
FIG. 5 is a schematic planar view of yet another second electrode of the organic electroluminescence element of the first embodiment.

The second electrode 40 may be formed to have a planar shape shown in FIG. 5. In this example, the second electrode 40 includes: four of first thin line sections 42 that are located at the outermost part and constitute an outer frame of the second electrode 40; one of second thin line section 43 extends in a first direction (top-bottom direction in FIG. 5) on the inside of the outer frame; and a plurality of thin line sections (third thin line sections) 44 each extend in a second direction (right-left direction in FIG. 5) crossing with the first direction on the inside of the outer frame. In the second electrode 40, the second thin line section 43 is located at the center in the right-left direction in FIG. 5 in a planar view, and the third thin line sections 44 extend between the first thin line sections 42 and the second thin line section 43. Each line width in a planar view of the first thin section 42 and the second thin section 43 is wider than the line width in a planar view of the third thin line section 44. According to a configuration where the second electrode 40 has a planar shape shown in FIG. 5, the organic electroluminescence element can have an improved luminous efficiency at the center region of the second electrode 40 which is far from the second terminal 47 (see FIG. 1) than the periphery, compared with a configuration shown in FIG. 2. As a result, this configuration can improve the external quantum efficiency. In the second electrode 40 having a planar shape shown in FIG. 5, the heights of the first thin line section 42 and the second thin line section 43, which have wider line width than the third thin line section 44, are preferably higher than that of the third thin line section 44, respectively. With this configuration, resistances of the first thin line section 42 and second thin line section 43 can be further lowered, respectively.

The conductive layer 50 is preferably constituted by either a transparent conductive film including conductive nanostructure and transparent medium; or a metal thin film having a thickness that allows to pass therethrough the light emitted by the functional layer 30. The conductive layer 50 has a lower conductive property than the second electrode 40. The conductive layer 50 has a higher conductive property than the second carrier injection layer 34. The conductive layer 50 serves as an injection pathway for transferring the second carrier from the second electrode 40 to the functional layer 30. In a configuration where the second electrode 40 is designed as an anode, the second carrier is hole. In a configuration where the second electrode 40 is designed as a cathode, the second carrier is electrode. Incidentally, when assuming such a case where the second electrode 40 is disposed directly on the functional layer 30 and the conductive layer 50 is omitted whereby the opening 41 is filled with the sealing member 90 having an electrical insulation property instead of the conductive layer 50, it would appear that the second carrier is injected from the second electrode 40 to the functional layer 30 only through a boundary surface between the second electrode 40 and the functional layer 30. On the contrary, in the configuration where the conductive layer 50 is provided, the second carrier is injected from the second electrode 40 to the functional layer 30 not only through "a first injection pathway" which passes through the boundary surface between the second electrode 40 and the functional layer 30 but also through "a second injection pathway" which passes through a boundary surface between the second electrode 40 and the conductive layer 50 and through a boundary surface between the conductive layer 50 and the functional layer 30.

In the second carrier injection layer 34, which is the outermost layer of the functional layer 30 on the second electrode 40 side, of the organic electroluminescence element of the embodiment, the thickness of the second carrier injection layer 34 of a region corresponding to the opening 41 is smaller than that of a region corresponding to the second electrode 40. In the organic electroluminescence element, the conductive layer 50 has a superior electrical conductivity and a superior injection property of the second carrier compared with the second carrier injection layer 34. In the organic electroluminescence element of the embodiment, it is therefore inferred that the second carrier is injected from the second electrode 40 into the functional layer 30 preferentially through the second injection pathway rather than the first injection pathway. Namely, because the second carrier injection layer 34 is provided with the recess 38, the embodiment has a lower resistance of the second injection pathway compared with a configuration where the recess 38 is not provided. This configuration facilitates the injection of the second carrier through the second injection pathway. Therefore, the second carrier flows toward the light emission layer 32 side through the projection domain of the opening 41 rather than the projection domain of the second electrode 40. As a result, the light emission layer 32 is to emit the light in the projection domain of the opening 41 rather than the projection domain of the second electrode 40. Because the light emitted by the light emission layer 32 is less likely to be blocked by the second electrode 40, the organic electroluminescence element of the embodiment has an improved external quantum efficiency. Because the second carrier injection layer 34 is provided with the recess 38, the second carrier is facilitated to spread into the in-plane direction (front-back and right-left directions in FIG. 1) of the conductive layer 50 from the second electrode 40 when transferring toward the light emission layer 32. This configuration therefore can reduce the unevenness of the electric current flowing in the in-plane direction in the light emission layer 32. Note that, the lower the resistivity of the conductive layer 50 is, the more the electric current flows to the lateral direction (front-back and right-left direction in FIG. 1) from the second electrode 40. Therefore, the lower resistivity of the conductive layer 50 can reduce the unevenness in the in-plane direction of the electric current flowing in the light emission layer 32 and can reduce the unevenness of the brightness.

Examples of the conductive nanostructures include conductive nano-particle, conductive nano-wire and the like. The conductive nano-particle preferably has a particle size of 1 [nm] to 100 [nm]. The conductive nano-wire preferably has a diameter of 1 [nm] to 100 [nm].

Examples of materials of the conductive nanostructure include silver, gold, ITO, IZO and the like. Examples of the transparent medium as binder include acrylic resin, polyethylene, polypropylene, polyethylene terephthalate, polymethylmethacrylate, polystyrene, polyether sulfone, polyarylate, polycarbonate resin, polyurethane, polyacrylonitrile, polyvinyl acetal, polyamide, polyimide, diacryl phthalate resin, cellulosic resin, polyvinyl chloride, polyvinylidene chloride, polyvinyl acetate, other thermoplastic resin, and copolymer containing at least two of the above-listed resin components. Note that, the material of the transparent medium is not limited thereto. It is preferable that conductive polymer is used for the binder. Examples of the conductive polymer include polythiophene, polyaniline, polypyrrole, polyphenylene, polyphenylenevinylene, polyacetylene, polycarbazole and the like. These materials can be used alone or in combination. With a configuration where the conductive polymer is used for the binder, the conductive layer 50 has a further improved conductivity. For the purpose of improving the conductivity, the binder may be doped with a dopant such as sulfonate acid, Lewis acid, proton acid, alkali metal, alkali earth metal and the like.

The conductive layer 50 can be formed by way of wet process such as coating method (spray coating, die coating, gravure printing, screen printing, or the like).

In a configuration where the conductive layer 50 is formed of the metal thin film, the metal thin film may be made of silver, gold, or the like. The thickness of the metal thin film is equal to or less than 30 [nm], is preferably equal to or less than 20 [nm], and is further preferably equal to or less than 10 [nm], from the viewpoint of the optical transparency. Note that, if the thickness of the conductive layer 50 becomes too thin, the injection property of the second carrier from the second electrode 40 to the functional layer 30 through the conductive layer 50 i.e. through the second injection pathway may be insufficient.

As described above, in the organic electroluminescence element of the embodiment, the resistivities of the first electrode 20 and the second electrode 40 are less than the resistivity of the transparent conductive oxide, respectively. The second electrode 40 is provided with the opening 41 for extracting light emitted from the functional layer 30. The functional layer 30 includes the second carrier injection layer 34 as the outermost layer thereof on the second electrode 40 side of the light emission layer 32. The organic electroluminescence element of the embodiment is provided with the optically transparent conductive layer 50 that is in contact with the functional layer 30 (the second carrier injection layer 34) and the second electrode 40. The second electrode 40 is covered with the conductive layer 50. The second carrier injection layer 34 is provided with the recess 38 in the projection domain of the opening 41. With this configuration, the organic electroluminescence element of the embodiment can reduce the unevenness of the brightness and can have the improved external quantum efficiency. The organic electroluminescence element of the embodiment can have further improved injection property of the second carrier from the second electrode 40 to the conductive layer 50, since the second electrode 40 is covered with the conductive layer 50.

In this organic electroluminescence element, it is preferred that "a height from the light emission layer 32 to the top surface of the conductive layer 50 at the region corresponding to the recess 38" (hereinafter, referred to as "first height") is smaller than "a height from the light emission layer 32 to the top of the second electrode 40" (hereinafter, referred to as "second height"). In the example shown in FIG. 3, the first height is defined as the sum of the thickness of the interlayer 33, the thickness of the second carrier injection layer 34 between the lower surface of the recess 38 and the top surface of the interlayer 33, and the thickness of the conductive layer 50 over the lower surface of recess 38. The second height is defined as the sum of the thickness of the interlayer 33, the thickness of the second carrier injection layer 34 in the projection domain of the second electrode 40, and the height H1 of the second electrode 40. In the organic electroluminescence element, because the first height is lower than the second height, the light loss in the conductive layer 50 can be reduced and the external quantum efficiency can be improved. Note that, magnitude relationship between the thickness of the conductive layer 50 and the depth of the recess 38 is not particularly limited.

Second Embodiment

Figure 6:
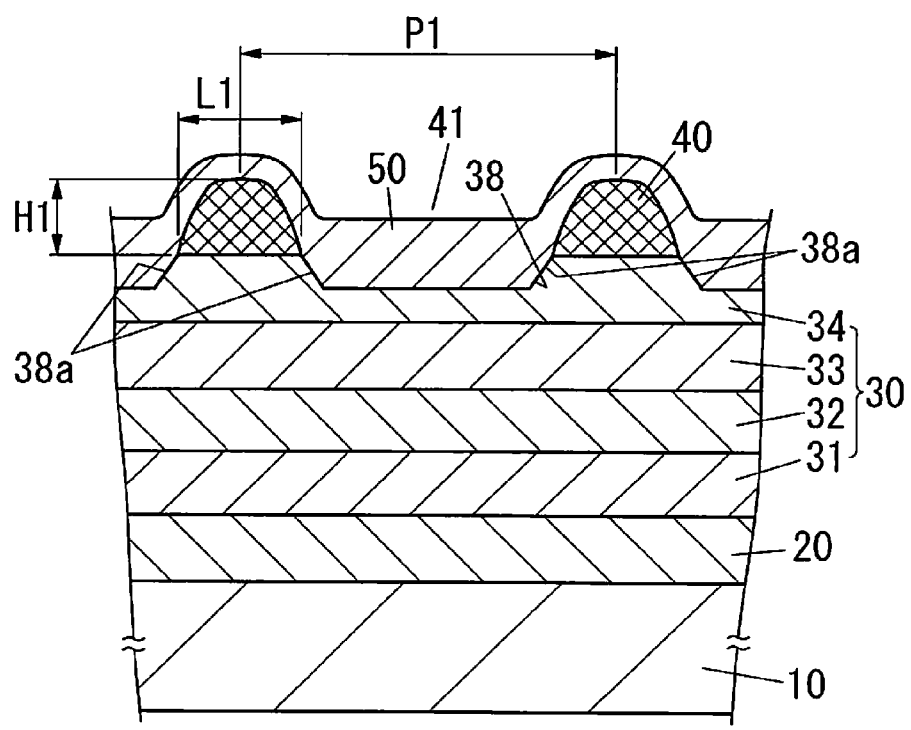
FIG. 6 is a schematic sectional view of main part of an organic electroluminescence element of second embodiment.
Figure 7:
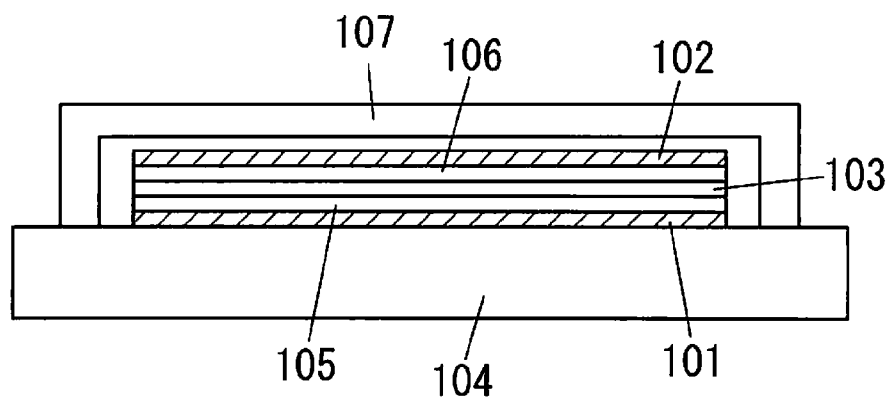
FIG. 7 is a schematic sectional view of a conventional organic electroluminescence element.
Figure 8:
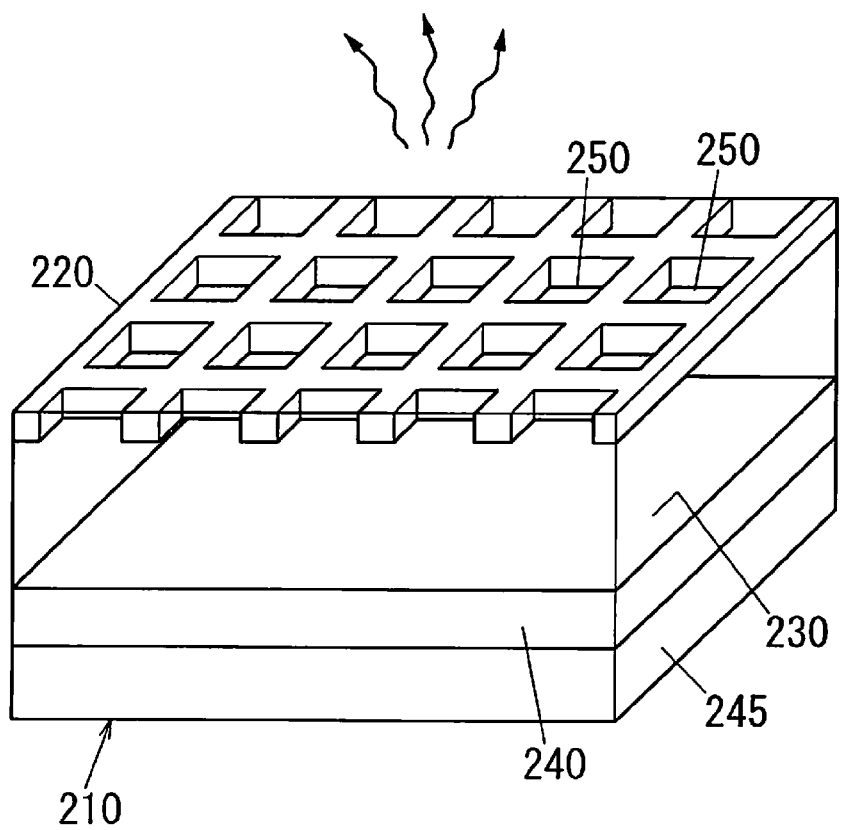
FIG. 8 is a perspective top view and sectional view of a conventional electroluminescent lamp.

The organic electroluminescence element of the embodiment has the substantially same configuration with the first embodiment, and as shown in FIG. 6 the shape of the recess 38 differs therefrom. Like kind elements are assigned the same reference numerals as depicted in the first embodiment and not explained in detail.

The recess 38 is formed in a shape that an interval between a boundary of the projection domain of the second electrode 40 and a side surface 38a of the recess 38 adjacent to this boundary increases with increasing distance from the second electrode 40 in the thickness direction of the second carrier injection layer 34. In the example shown in FIG. 6, the recess 38 is formed in a substantially inverted trapezoidal shape in sectional view, unlike the example shown in FIG. 3 in which the recess 38 is formed in a substantially rectangular shape in sectional view.

In the organic electroluminescence element of the embodiment, the recess 38 is formed so that the interval, in the direction orthogonal to the thickness direction of the second carrier injection layer 34, from the second electrode 40 to the side surface 38a of the recess 38 increases with distance from the second electrode 40 in the thickness direction of the second carrier injection layer 34. In other words, in the organic electroluminescence element of the embodiment, the thickness of the second carrier injection layer 34 in the projection domain of the opening 41 decreases with distance from the second electrode 40. In the organic electroluminescence element of the embodiment, the second carrier injection layer 34 in the projection domain of the opening 41 therefore has "a layer-thickness changing section" in which the layer thickness gradually decrease, where "the region in which the interval from the second electrode 40 to the side surface 38*a* changes" is regarded as the layer-thickness changing section. In the second carrier injection layer 34, the amount of the second carrier injected from the second electrode 40 increases toward the second electrode 40. On the other hand, the second carrier less likely passes through the second carrier injection layer 34 with increasing the thickness of the second carrier injection layer 34. Therefore, this configuration can improve the uniformity of the injection amount of the carrier in the second carrier injection layer 34, in the projection domain of the opening 41. As a result, this configuration can further reduce the unevenness of the brightness.

In the example shown in FIG. 6, the second carrier injection layer 34 has a unique thickness at a region distant from the second electrode 40 in the width direction (right-left direction in FIG. 6) of the second electrode 40. However, the thickness of the second carrier injection layer 34 is not limited to such a configuration, and may gradually decrease with increasing distance from the second electrode 40. The shape of the side surface 38*a* of the recess 38 is not limited to a flat surface as shown in FIG. 6, and may be a curved surface. For example, the shape of the recess 38 may be a barrel shape.

The organic electroluminescence element described in the first and second embodiments can be used for lighting purpose. Note that, the organic electroluminescence element is not limited to be used for lighting, and can be used for other purposes.

Note that, the figures used for describing the first and second embodiments are schematic ones, and do not necessarily show the actual ratio of the length, thickness, or the like of the components.

Although the present invention has been described with reference to certain preferred embodiments, numerous modifications and variations can be made by those skilled in the art without departing from the true spirit and scope of this invention, namely claims.

The invention claimed is:

1. An organic electroluminescence element comprising:
 a substrate;
 a first electrode arranged on a first surface side of the substrate;
 a second electrode arranged on the first surface side of the substrate so as to face the first electrode; and
 a functional layer interleaved between the first electrode and the second electrode, the functional layer including a light emission layer,
 wherein the resistivities of the first electrode and the second electrode are less than the resistivity of transparent conducting oxide, respectively,
 wherein the functional layer includes a carrier injection layer as the outermost layer, the carrier injection layer being located on the second electrode side of the light emission layer,
 wherein the second electrode is provided with an opening for extracting light emitted from the functional layer,
 wherein a conductive layer is formed in the opening so as to be in contact with the second electrode and the functional layer, the conductive layer being optically transparent,
 wherein the second electrode is covered with the conductive layer, and
 wherein the carrier injection layer is provided with a recess in the projection domain of the opening.

2. The organic electroluminescence element as set forth in claim 1, wherein the recess is formed in a shape that an interval between a boundary of the projection domain of the second electrode and a side surface of the recess adjacent to this boundary increases with increasing distance from the second electrode in the thickness direction of the carrier injection layer.

3. The organic electroluminescence element as set forth in claim 1, wherein the second electrode is an electrode including metallic powder and organic binder.

4. The organic electroluminescence element as set forth in claim 1, wherein the conductive layer is a transparent conductive film including conductive nanostructure and transparent medium; or a metal thin film having a thickness that allows to pass therethrough the light emitted from the functional layer.

5. The organic electroluminescence element as set forth in claim 1, wherein a thickness of the carrier injection layer in the projection domain of the opening is smaller than a thickness of the carrier injection layer in the projection domain of the second electrode.

6. The organic electroluminescence element as set forth in claim 2, wherein the second electrode is an electrode including metallic powder and organic binder.

7. The organic electroluminescence element as set forth in claim 2, wherein the conductive layer is a transparent conductive film including conductive nanostructure and transparent medium; or a metal thin film having a thickness that allows to pass therethrough the light emitted from the functional layer.

8. The organic electroluminescence element as set forth in claim 3, wherein the conductive layer is a transparent conductive film including conductive nanostructure and transparent medium; or a metal thin film having a thickness that allows to pass therethrough the light emitted from the functional layer.

9. The organic electroluminescence element as set forth in claim 6, wherein the conductive layer is a transparent conductive film including conductive nanostructure and transparent medium; or a metal thin film having a thickness that allows to pass therethrough the light emitted from the functional layer.

* * * * *